United States Patent [19]
Washburn et al.

[11] Patent Number: 5,661,647
[45] Date of Patent: Aug. 26, 1997

[54] LOW TEMPERATURE CO-FIRED CERAMIC UHF/VHF POWER CONVERTERS

[75] Inventors: Robert D. Washburn, Malibu; Robert F. McClanahan, Valencia; Andrew A. Shapiro, Orange; Ramona G. Pond, Downey; Gerald P. Chernicky, Fountain Valley; William J. Council, Newbury Park; Earl H. Martin, Moorpark, all of Calif.

[73] Assignee: Hughes Electronics, Los Angeles, Calif.

[21] Appl. No.: 473,411

[22] Filed: Jun. 7, 1995

[51] Int. Cl.$^6$ .................. H02M 1/00; B32B 9/00
[52] U.S. Cl. ................................ 363/147; 428/210
[58] Field of Search ...................... 363/147, 123, 363/16; 428/210; 361/767, 790, 792

[56] References Cited

U.S. PATENT DOCUMENTS 4,980,810 12/1990 McClanahan et al. .............. 363/16
5,312,674 5/1994 Haertling et al. .................. 428/210
5,412,539 5/1995 Elwell et al. ...................... 361/792

*Primary Examiner*—Adolf Berhane
*Attorney, Agent, or Firm*—Leonard A. Alkov; Wanda K. Denson-Low

[57] ABSTRACT

Electronic VHF/UHF power conversion circuitry is manufactured using the benefits of low temperature co-fired ceramic substrates to provide interconnection between the discrete components of the power conversion circuit, and integrate various non-semiconductor devices into the body of the low temperature co-fired ceramic structure, such as resistors, capacitors, inductors and transformers. Use of a low temperature co-fired ceramic structure as a substrate on and within which VHF/UHF power conversion circuitry is formed allows selection of various conductive and resistive inks to precisely form interconnection circuitry and selected non-semiconductor components which improves the stability and reduces the cost of VHF/UHF power conversion circuits.

18 Claims, 3 Drawing Sheets

LOW TEMPERATURE CO-FIRED CERAMIC UHF/VHF POWER CONVERTERS

FIELD OF THE INVENTION

The present invention generally relates to implementing VHF or UHF power conversion circuits using low temperature co-fired ceramics. Low temperature co-fired ceramics can be used to form nearly all of the non-semiconductor components required. Low temperature co-fired ceramics allow precision passive components to be formed in precise alignment relative to each other as an integral part of the substrate, effectively creating a power passive integrated circuit. It further permits all necessary components thus formed to be precisely trimmed to the desired value. Stripline and microstrip design techniques are readily applied using low temperature co-fired ceramic substrate construction.

BACKGROUND OF THE INVENTION

The present invention generally relates to the fabrication of power converter circuitry formed on substrates which are made from low temperature co-fired ceramic material and which have the passive components as an integral part of the substrate. Previously, power converter substrates were formed on circuit boards, or as power hybrids. Printed circuit boards provide traces for interconnecting a number of discrete components which are usually soldered to the circuit board. Component mounting may be either surface or through hole. Hybrids are created using thick and/or thin film manufacturing techniques to create a single surface substrate which usually has non-critical, low power dissipation resistive elements integrally formed with it. Some small value, low power inductive elements can be formed on the surface of the hybrid with thick film techniques but most magnetic components must be discrete, and mounted external to the hybrid structure (usually attached to the power converter heat sink). As with the inductive components, low voltage capacitors can be formed on the top layer of the substrate using thick film processes. However, these techniques are not suitable for the construction of high value, power or current handling components. These are realized as discrete devices and are mounted either on the surface of the hybrid (for the smaller parts) or more frequently external to the hybrid. Active components, such as semiconductor devices, are typically epoxied to the surface of the hybrid substrate, and wire bonded using gold or aluminum wire to bonding sites on the surface of the hybrid substrate.

Both printed circuit boards and hybrids have disadvantages in fabrication. Printed circuit boards require the use of numerous discrete components. Each must be inserted into or onto the circuit board, where leads may require shaping or trimming, and then sent through a solder bath to attach the components to the circuit board. This can expose the components and the circuit board to temperatures in excess of 600 degrees Fahrenheit. Active components are especially sensitive to elevated temperatures and may be damaged by heating. Especially with high frequency applications, small precision inductors and capacitors are easily damaged by being exposed to this high temperature. In the case of surface mounted components, where the component leads may require bending and trimming, and the part properly oriented and placed on the surface, this problem of soldering heat exposure is also encountered. The preceding considerations apply both to wave soldering and hand soldering.

Although the criticisms of the state of the art listed in the previous paragraph can be substantiated as generally accurate, lest they give the mistaken impression that current methods are quite inadequate, it must be added that many good power supplies have been built with those techniques and used with satisfaction by their operators. For example, exposure of components to high temperature during soldering can unquestionably damage the devices, but this can be and often is avoided by proper techniques and controls in the manufacturing process along with good engineering practice in the design of the components. The present invention is superior in that it generally eliminates or greatly reduces the exposure of components to the stress of solder attachments (though this advantageous feature is not advocated as the most significant feature of the presently disclosed invention).

This invention can be constructed and frequently will be constructed with some soldered components (the active components, certain very large value energy storage devices, or certain very high precision components) which either can not be integrated into the low temperature co-fired ceramic substrate, or are used in discrete form at the discretion of the designer. However, this invention will always have a greatly reduced number of solder connections compared to present techniques. This will translate into a statistical reduction in the number of defective solder joints and thereby improve overall manufacturing yield.

The reduced number of solder connections in this invention is a major benefit to the long term reliability of power supplies, which typically have significant internal power dissipation. This can subject the components and connections to large and frequent temperature changes in addition to those caused by variations in the ambient temperature of the unit operating environment. This results in the application of significant mechanical stress on the solder joints and can lead to increasing failures as the product ages, particularly those with latent defects; however, the present invention ameliorates and alleviates this well known problem.

Variations in components, solder composition, heating of the solder, placement of the small components on the circuit board, variations in hole plating, and components floating partially out of the holes in the printed circuit board all lead to variations between devices manufactured on the same production line. This means that two consecutive power conversion devices manufactured on printed circuit boards can have a variation in characteristics significant enough to cause additional circuitry to compensate for the variability to be incorporated into the design, or expensive material and process controls added to the manufacturing process. In either case, the result is a significant increase in the cost of the power supply.

This matter of variability control is an important advantageous characteristic of the present invention which is significant not only in the assembly procedures which it eliminates, but with the materials, processes and components themselves. In the present art, each individual discrete component is made with a variety of different materials whose composition will vary from manufacturing lot to lot. Each is also fabricated with a variety of different processes, each element and step of which has its own variability. This variability is ultimately reflected in the characteristics and cost of the discrete components. The discrete components can even be made by different manufacturers who use totally different materials, processes, and controls. The only present, effective methods of limiting this variability are through the use of tight specifications which can place severe material and process controls on the component manufacturer, and compliance testing and screening to verify the effectiveness of the process controls. Both of these can significantly increase the cost of the discrete components and therefore the entire power supply.

The above-described variability is also not fixed or even defined with time. It is common for component manufacturers to "improve" their products and processes. Sometimes the use of these improved devices (the older forms of which are no longer made) results in power supplies, which have been produced and worked well for years, suddenly developing a variety of problems or not functioning at all (either generally or in particular applications or under particular conditions). Therefore the advantageous feature of variability control is expected to enhance the commercial utility of the present invention.

Hybrid fabrication also has its characteristic difficulties. Thin film hybrid techniques generally result in a superior conductive layer with respect to thick film techniques because a uniform thickness layer of gold or other conductive material is etched away to leave a uniform thickness conductor which has a precise predetermined width. Resistive inks are then screened onto the hybrid substrate and trimmed to the proper value by laser trimming, or sandblasting techniques (although there are precision thin film resistors which do not require trimming). Capacitors cannot be integrally combined with a thin film hybrid substrate.

Capacitors are attached by the use of solder paste, conductive epoxy, and/or wire bonding. Conductive epoxy is not as conductive. Also, solder preforms may be used. Active components are wire bonded to conductive pads on the hybrid substrate. Wire bonding techniques are not perfect, and wire bonding is usually followed by a wire bond pull test to insure the integrity of the wire bonds. Additionally, the wire bond must be made directly to the bonding pad of the semiconductor device. This requires local ultrasonic heating and vibration to etch the wire bond material into the wire bond site of the semiconductor device. Each pad must be individually bonded to the substrate. The thickness of each wire that can be bonded to the semiconductor device and the substrate is limited. Techniques have been applied that use multiple wire bonds or ribbon bonding to increase the current carrying capability of the connection. The use of these techniques increases the current carrying capability, but increases the number of fabrication steps required, and the complexity of those fabrication steps. Wire bonds are flexible and may be of varying lengths, thereby changing minute characteristics of inductance, etc.

There is a further limitation on the usefulness of thick film hybrid technology. It is well known that following firing, thick film resistors do not remain fixed during subsequent firings but continue to change characteristics. The subsequent firings appear to a previously fired resistor as an extended firing period with included temperature cycling under a different set of conditions (covered by the fired and/or dried material of subsequently applied layers). At best, the resistor tolerance is a function of the number of substrate firing cycles subsequent to its own formation and the tolerances associated with this processing. If they otherwise could be used as precision resistors, it would be necessary to locate them as close to the top of the substrate as possible (probably on a single layer), limit the number of resistive paste materials (probably to one), and severely restrict the total number of precision resistors (and networks) in the circuit. Furthermore, due to the limited thickness of hybrid film resistors, their power dissipation capability is small which limits their usefulness for power supply applications. As a result, thick film resistors are best utilized in low power dissipation circuit applications in which values are not critical.

Additionally, fabrication of printed circuit boards requires the extensive use of acids, photoresist, and other chemicals to deposit and etch circuit boards. Thin film hybrid manufacturing similarly requires use of numerous acids and photoresist to etch away metallization. Thick film hybrid manufacturing does not use the wide variety of active chemicals that are used in the manufacture of thin film hybrids, and printed circuit boards. However, because of the manner in which conductive layers are screened onto a thick film hybrid, the resistivity, shape and dimensional stability of a thick film hybrid circuit is more difficult to control.

The present invention solves the problems associated with building power conversion circuitry in hybrids or on standard printed circuit boards by reducing the number of manufacturing steps, reducing the variety of manufacturing steps, and implementing manufacturing steps and processes that can be more accurately controlled and with less effort than previous technology.

Also the present invention does not require the use of extensive chemical processes in order to manufacture a substrate which has superior electrical characteristics, and can be more easily and accurately manufactured at a lower cost than prior art devices.

The present invention is closely related to issued and co-pending patents assigned to the assignee of the present invention, including U.S. Pat. No. 4,980,810, issued Dec. 25, 1990 and pertaining to "VHF DC-DC Power Supply Operating at Frequencies Greater than 50 Mhz"; U.S. Pat. No. 5,055,966, issued Oct. 8, 1991, on "Via Capacitors within Multi-layer, Three-Dimensional Structures/Substrates,"; and U.S. Pat. No. 5,164,699, issued Nov. 17, 1992, on "Via Resistors within Multi-layer, Three Dimensional Structures/Substrates." The related co-pending applications include Ser. No. 07/951,072, filed Sep. 24, 1992 on "Magnetic Vias within Multi-layer, Three Dimensional Structures/Substrates;" Ser. No. 07/951,504 filed Sep. 24, 1992 on "Field Control and Stability Enhancement in Multilayer 3-Dimensional Structures;" Ser. No. 07/923,409, filed Jul. 31, 1992, on "Low-Temperature-Cofired-Ceramic (LTCC) Tape Structures Including CoFired Ferromagnetic Elements, Drop-In Components and Multi-Layer Transformer;" and Ser. No. 07/951,473, filed Sep. 24, 1992 on "Dielectric Vias within Multi-layer Three Dimensional Structures/Substrates."

SUMMARY OF THE INVENTION

The invention is generally related to the use of low temperature co-fired ceramics which function as both passive integrated circuits and substrates for power conversion modules. Low temperature co-fired ceramics have several distinct advantages over conventional circuit boards, including the following:

1. The passive components (resistors, capacitors, inductors, and transformers) are made integral to and in the same process that forms the substrate. This saves the cost of the individual components.
2. Since the integrated passive components throughout the power supply are formed from the same materials, variations are both minimized and tend to be in one direction. Example: Variations in the resistivity of a resistor ink will be reflected in all of the resistors made using that ink. This makes them tend to be all high or all low by approximately the same percentage rather than following normal discrete component value distributions. This results in smaller variations in circuits such as resistor dividers where the ratio of values is important.

3. At VHF/UHF frequencies the common PWB materials have very high losses, which in power conversion circuitry will typically result in burning up the board. This can be overcome by the use of exotic materials, but these are typically much more expensive than either normal fiberglass PWBs or the low temperature co-fired ceramics used in this invention.

4. A co-fired ceramic has a coefficient of thermal expansion which more closely matches the thermal coefficient of expansion to the material of the integrated circuits (typically silicon but the LTCC can be formulated and processed to match other semiconductor materials such as GaAs, Ge, InP, etc.).

Combining the use of low temperature Co-fired ceramics with the circuit and power requirements of power conversion circuitry has not previously been attempted. Combining these technologies produces unforeseen results not heretofore achieved.

The low temperature co-fired ceramic is capable of having unpackaged power semiconductor devices mounted on its surface. In this manner, heat can be more rapidly distributed from the semiconductor device, thus preventing the semiconductor device from overheating and burning out. The low temperature co-fired ceramic substrate can also have discrete passive components mounted on its surface. Certain passive components, such as resistors, also generate substantial quantities of heat depending on the particular circuit application.

The use of low temperature co-fired ceramics provides a platform for mounting the discrete devices. Unlike the previously used laminated boards, the low temperature co-fired ceramics can aid in heat distribution, through thermal vias and embedded heat-spreading materials, helping to prevent overheating components. Ventilation holes can be formed in the low temperature co-fired ceramic structure to further encourage air flow and cooling of both the ceramic itself and the heated component.

Precision resistors, capacitors and inductors can be precisely formed within the low temperature co-fired ceramic structure, eliminating the need to attach discrete devices to the surface of the ceramic structure. This is especially useful when dealing with high frequency applications, where the values of the passive components are extremely small, and the variation in electrical characteristics due to inefficiencies in attaching discrete components to circuit boards becomes critical.

It is an object of the present invention to achieve design requirements of VHF/UHF power conversion circuitry utilizing the favorable characteristics and features of low temperature co-fired ceramic substrates to maximize the number of passive components which can be formed internal to the substrate.

It is a further object of the present invention to achieve design requirements of VHF/UHF power conversion circuitry utilizing the favorable characteristics and features of low temperature co-fired ceramic substrates to mitigate the undesirable characteristics of known power converter substrates.

It is a further object of the present invention to utilize a low temperature co-fired ceramic substrate in VHF/UHF power conversion circuitry in order to reduce the number of fabrication steps needed, resulting in an increased manufacturing yield.

This benefit will be achieved because of the ability of low temperature co-fired ceramic substrates to have passive components embedded into the low temperature co-fired ceramic structure, thus reducing the number of discrete electronic components, which in turn reduces the number of assembly steps and the inherent cost of assembly.

It is a further object of the present invention to utilize the near hermetic character of low temperature co-fired ceramic substrates to fabricate passive components which are stable over a wide range of temperature and humidity, and are suitable for high volume production.

It is a further object of the present invention to improve the performance and reduce the cost of VHF/UHF power conversion modules by utilizing the characteristics of low temperature co-fired ceramics. This includes conductivity of the conductor lines, and the ability to generate wide conductors or parallel conductors on multiple layers within the low temperature co-fired ceramic in order to achieve a high carrying capability. Further advantages include high dielectric voltage breakdown, the use of materials with variable dielectric constants, the ability to incorporate ferrites within the low temperature co-fired ceramic structure, the ease of manufacturing a structure having cavities which accommodate predetermined components, such as high power dissipation devices, and the use of thermal vias and metallic inserts to provide heat sinks, mitigating the adverse effects of thermal conductivity characteristics.

It is a further object of the present invention to create a low temperature co-fired substrate for VHF/UHF power conversion circuitry which incorporates all passive components within the low temperature co-fired ceramic structure.

It is a further object of the present invention that the only devices attached to the external surface of the low temperature co-fired ceramic substrate will be active semiconductor components, and occasional high power dissipation or energy storage passive components.

It is an object of the present invention to implement all forms of power conversion circuitry, including AC-AC, AC-DC, DC-DC, and DC-AC circuitry using a substrate formed out of low temperature co-fired ceramics. The use of the low temperature co-fired ceramic structure as an interconnection medium which incorporates substantially all of the discrete components within it results in a smaller power conversion module which has superior stability with respect to VHF/UHF power conversion circuitry formed of discrete components. These VHF/UHF power conversion modules are also less expensive to manufacture, and are easier to build because of the reduced number of highly reliable steps involved in constructing low temperature co-fired ceramics. These techniques include the use of cavities, thermal vias and heat sinks, resistive and capacitive inking systems, and conductive inking systems which are screened onto the ceramic substrate, then fired and precision trimmed with a laser or suitable apparatus to create highly precise component values.

DESCRIPTION OF AN EXEMPLARY PREFERRED EMBODIMENT

The preferred embodiment of the present invention implements VHF/UHF power conversion utilizing the superior characteristics of low temperature co-fired ceramic substrates. The standard definition of VHF comprises frequencies between 30 and 300 MHz; and the standard definition of UHF comprises frequencies between 300 and 3000 MHz. Power conversion circuitry which operates at higher or lower frequencies or DC could conceivably be implemented by those skilled in the art by applying the teaching of the present invention. The present invention combines the benefits of low temperature co-fired ceramic structures with electronic power conversion circuitry in order to create a circuit which is smaller, lighter, more efficient, and easier to manufacture. These circuits include AC-DC, DC-DC, DC-AC, and AC-AC power conversion circuitry, and can be used individually or in combination with each other. For example, efficient DC-DC conversion can be accomplished by converting DC to a high frequency AC signal, and then converting the high frequency AC signal to a DC voltage of a different level than the input voltage. This type of conversion has benefits over standard linear conversion circuitry. Nearly all of the non-semiconductor (passive) components are manufactured as an integral part of the low temperature co-fired ceramic substrate.

Figure 1:
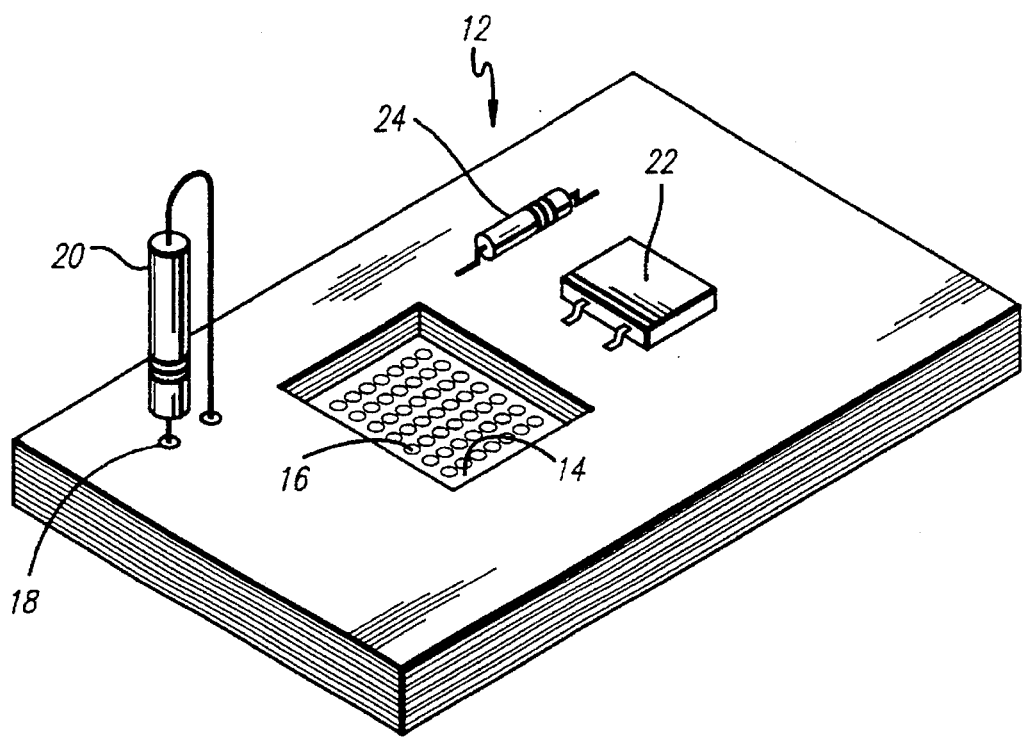
FIG. 1 is an external perspective drawing of a low temperature co-fired ceramic substrate showing examples of surface mounted components.

As shown in FIG. 1, the low temperature co-fired ceramic substrate consists of a plurality of layers. The ceramic layers insulate, and isolate metallized conductors which are selectively located on the outer surface, and various inner layers of the low temperature co-fired ceramic substrate. The low temperature co-fired ceramic substrate includes use of conductors which are fired in a reduced atmosphere, such as copper, and metallized conductors which are fired in the presence of air (termed oxidizing atmosphere firing), which is used for firing noble metals and alloys.

The low temperature co-fired ceramic substrate structure 12 of FIG. 1 shows a cavity 14 within the low temperature co-fired ceramic substrate 12. Thermal vias 16 are shown in the lower portion of cavity 14. A cavity 14 may be formed with or without forming thermal vias 16 in the surface of low temperature co-fired ceramic substrate 12 immediately beneath cavity 14. A cavity 14 is formed, as required by the application, in order to house discrete components which require substantial cooling, such as high power dissipation devices, or to house discrete components which would otherwise undesirably protrude above the surface of the low temperature co-fired ceramic substrate. These discrete components include semiconductor devices and non-semiconductor devices.

Heat sinks (not shown) can be inserted into low temperature co-fired ceramic substrate 12 in order to reduce thermal resistance through the low temperature co-fired ceramic substrate 12, and to dissipate heat generated by components on the surface of or within the low temperature co-fired ceramic substrate 12. Cavities 14, thermal vias 16 and heat sinks (not shown) provide thermal management of a low temperature co-fired ceramic substrate in order to prevent localized heating or super-heating, which may lead to unequal thermal expansion within low temperature co-fired ceramic substrate 12, resulting in microscopic thermal fractures of low temperature co-fired substrate 12.

The low temperature co-firing ceramic process permits the selection of numerous conductive inks, as required by the particular circuit configuration to be manufactured.

Low temperature co-fired ceramic substrate 12 has within it holes 18, which are formed in order to accommodate placement of through hole mounted discrete components 20 in low temperature co-fired ceramic substrate 12. Through hole mounted components 20 and holes 18 are selectively utilized to optimize performance of the electronic power conversion circuitry.

Semiconductor components are attached to low temperature co-fired ceramic substrate 12 as through hole mounted discrete components 20, or by the use of surface mounting techniques. Semiconductor devices which are attached to low temperature co-fired ceramic substrate 12 using surface mounting techniques must be encapsulated in a surface mount packaging 22. This includes the use of both the leadless and leaded surface mount device packages.

Non-semiconductor devices are attached to low temperature co-fired ceramic substrate 12, as required by the power conversion circuit design. An example of a discrete surface mounted non-semiconductor device 24 is indicated by reference number 24 in FIG. 1. Typically, non-semiconductor type devices which are attached to low temperature co-fired ceramic substrate 12 through the use of surface mounting techniques (such as 24) or through the use of hole mounted techniques (such as 20) are devices which are intended to dissipate a substantial amount of power and generate a substantial amount of heat, such as loading resistors.

Various strip line components are formed within the low temperature co-fired substrate as required by the particular circuit design, and component values selected. As shown in FIG. 2, microstrip inductors 30 and 32 can be readily formed and embedded within the temperature co-fired ceramic substrate. The dimensions of the traces will determine the particular component value. Making the trace wider or narrower, longer or shorter, will effectively alter the electrical characteristics of the component. Higher currents can be accommodated by using complex structures such as multilayer parallel conductors 42 and 44. Inductors on the order of nano-henrys are effectively formed in this manner.

Capacitors are also effectively formed in a similar manner. A parallel plate capacitor 38 is readily formed by locating two parallel structures 40 adjacent to each other, separated by the low temperature co-fired ceramic structure in between. The dielectric constant of the low temperature co-fired ceramic structure and the size of the overlaid conductors thus determines the value of the capacitor. Capacitive values on the order of pico-farads are readily formed within a low temperature co-fired ceramic structure without occupying an excessive amount of area.

In order to effectively isolate electronic signals, the use of various ground plane layers 32, 54 and 58 is necessary. These ground planes provide sufficient electrical isolation between parallel or adjacent traces within a low temperature co-fired ceramic structure.

For devices 34 and 36 which generate a large amount of heat, cavities 37 and 48 can be formed within the low temperature co-fired ceramic structure, and a heat sink 36 inserted into cavity 37 to aid in thermal management of the circuit. Additional thermal management techniques includes placing a component 46 within the cavity as shown in FIG. 2 by reference number 46; and thermal vias 50 may be located within the LTCC substrate between an external heat sink 36 or 51 and devices 34 and 48 which generate a large amount of heat to further aid in thermal management. Large holes 60 and 62 can also be made through the entire LTCC substrate to accommodate heat sinks which are an integral part of package of large heat generating devices.

The use of multilevel resistor arrays 56 and 58 allow a designer to design and construct a circuit in which the output of an electronic device is oriented at right angles to the input of the electronic device. As will be appreciated, this minimizes crosstalk between the signal lines.

Figure 4:
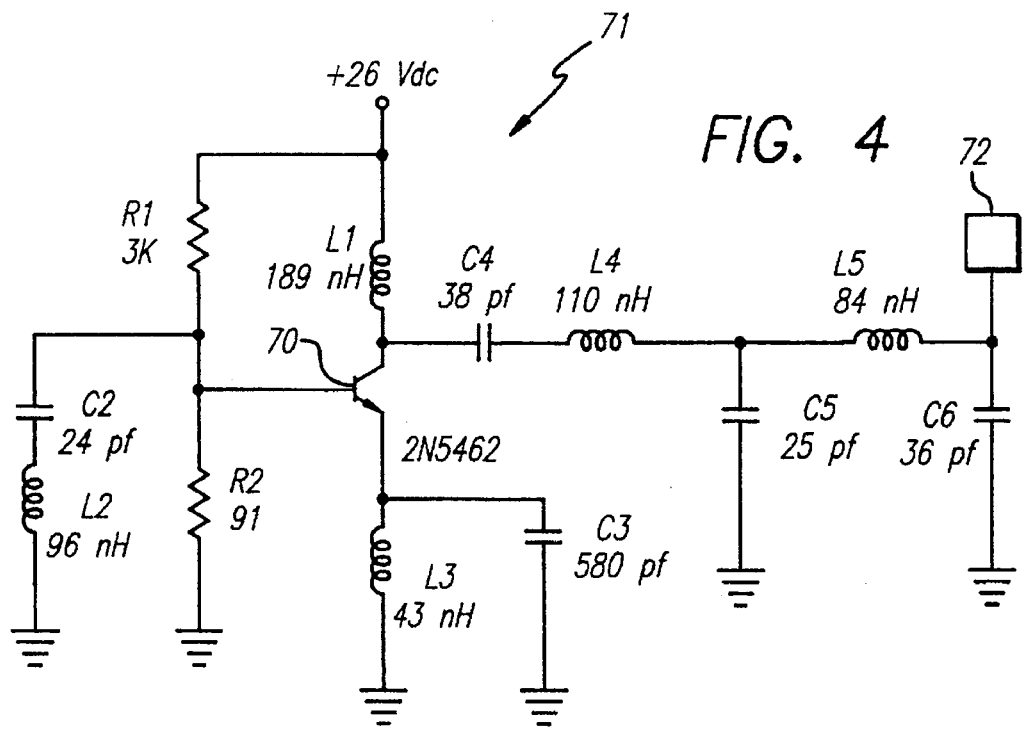
FIG. 4 is a schematic circuit diagram of a DC-AC converter (power oscillator) employing the presently disclosed technology.
Figure 5:
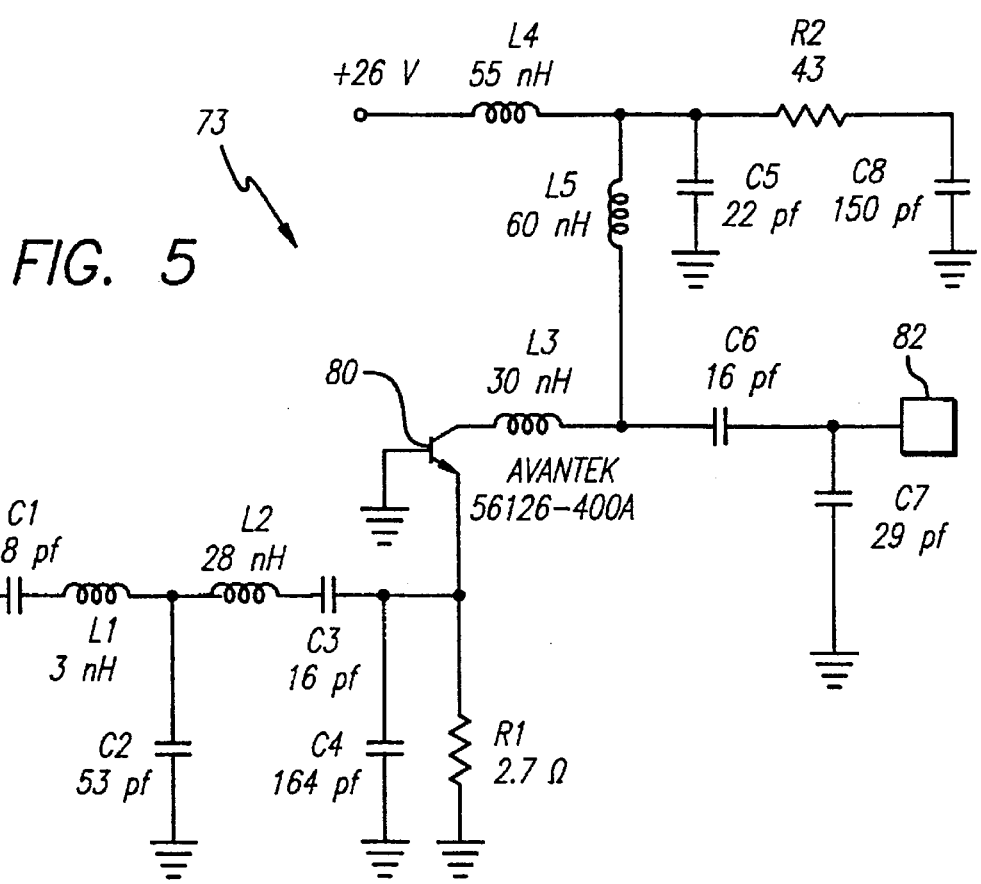
FIG. 5 is a schematic circuit diagram of a power amplifier employing this technology.

Power converters, such as the DC-AC converter 71 shown in FIG. 4, and the amplifier 73, as shown in FIG. 5, can be readily implemented using low temperature co-fired ceramic techniques. Because of the operating frequencies of these devices, the values of the components are extremely small, and are readily fabricated within a low temperature co-fired ceramic structure. The value of the inductors are all in the order of nano-henrys, and the value of the capacitors are all on the order of pico-farads. Several resistors are also needed to build the circuits. Various resistive inks are readily applied to create resistors, or resistor arrays buried within the low temperature co-fired ceramic.

The DC-AC power converter 71 shown in FIG. 4 requires a single semiconductor device 70, which is a transistor. This transistor 70 is mounted on the outer surface of the low temperature co-fired ceramic substrate, or placed within a cavity as desired.

The DC-AC power converter of FIG. 4 is a 100 Mhz, 7.5 watt nominal output power tuned based oscillator or circuit when terminated with a 50 ohm resistive load 72. This value was selected to facilitate its use with laboratory test equipment and is not critical. The power level is also not critical and the passive component can be readily modified to achieve outputs between 3 and 11 watts.

Figure 3:
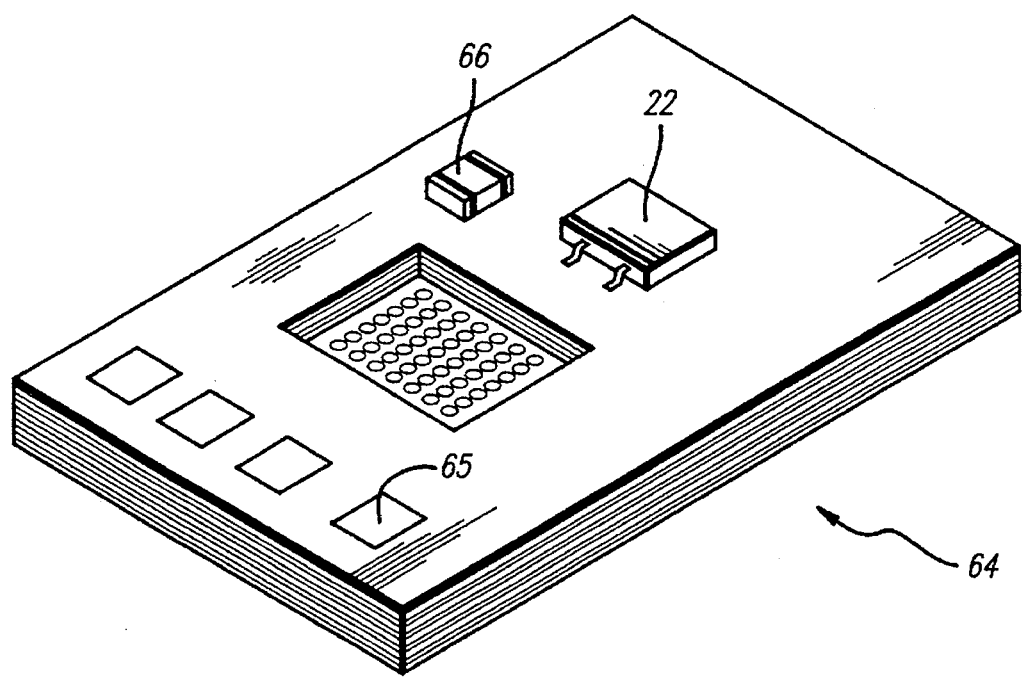
FIG. 3 is an external perspective drawing of a low temperature co-fired ceramic substrate showing examples of through hole mounted components.
Figure 2A:
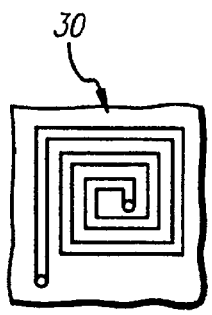
FIGS. 2a, c, e, g, i, k, m and o, constitute top views of these buried components, while FIGS. 2b, d, f, h, j, l, n and p, respectively, constitute corresponding side views.
Figure 2C:
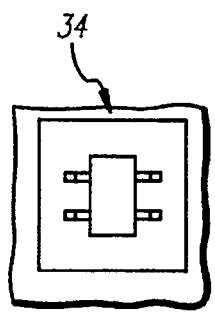
FIG. 2 contains cross-sectional depictions of certain physical details of the buried components which are not visible in the external views of FIG. 1 and FIG. 2.
Figure 2E:
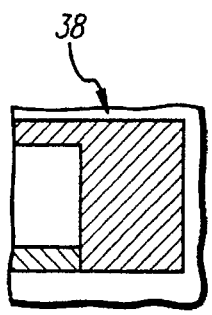
Figure 2G:
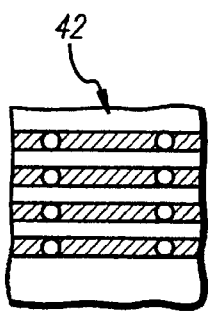
Figure 2B:
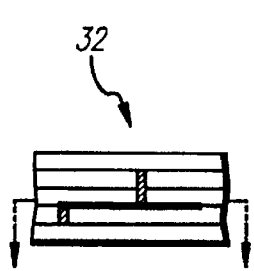
Figure 2D:
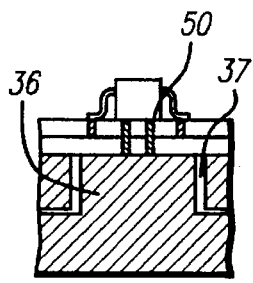
Figure 2F:
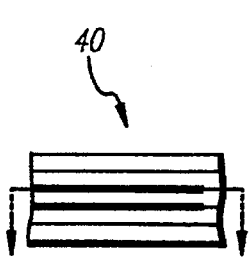
Figure 2H:
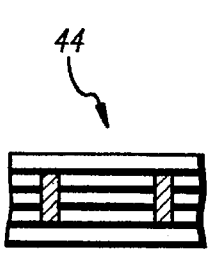
Figure 2I:
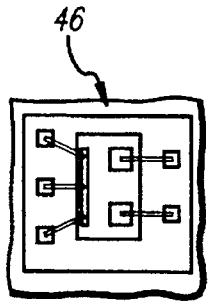
Figure 2K:
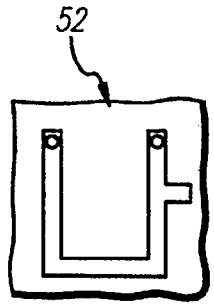
Figure 2M:
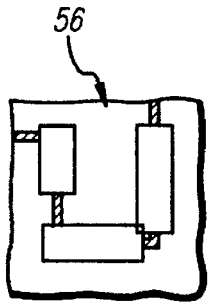
Figure 2O:
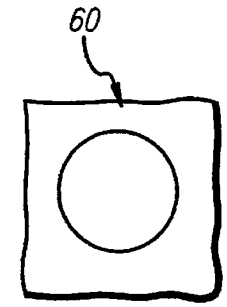
Figure 2J:
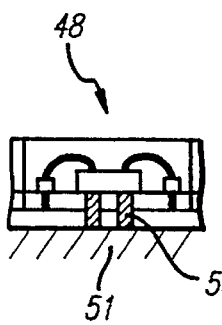
Figure 2L:
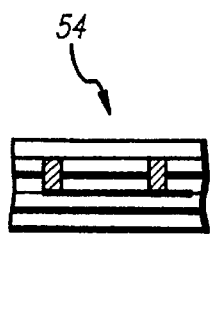
Figure 2N:
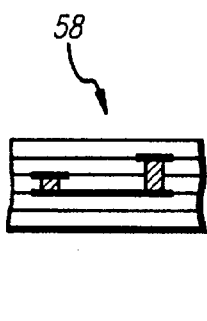
Figure 2P:
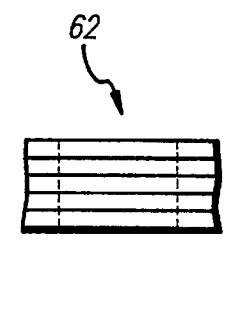

The amplifier 73 shown in FIG. 5 operates with a single semiconductor device 80 into a 50 ohm resistive load 82. As with transistor 70 in FIG. 4, transistor 80 as shown in FIG. 5 can be surface mounted, such as item 22 in FIG. 1 or FIG. 3, on an external surface of the low temperature co-fired ceramic 12, or located in a cavity 14 as shown in FIG. 1.

RAMIFICATIONS AND SCOPE

Although the preceding description contains many specificities, these should not be construed as limiting the scope of the invention but merely as providing illustrations of some of the presently preferred embodiments of this invention. Those skilled in the most relevant arts will recognize that many variations upon the above examples are obvious and possible without departing from the spirit and scope of the present invention. For example, multiple circuits may be formed on a single substrate with different component positions and patterns.

Accordingly the scope of this invention should be determined only by the appended claims and their appropriately construed legal equivalents, rather than by the examples given.

What is claimed is:

1. A VHF/UHF electronic power converter circuit formed within a low temperature co-fired ceramic substrate comprising:

(1) a low temperature co-fired ceramic substrate; and (2) a VHF/UHF electronic power converter circuit, a selected plurality of the passive components thereof buried within said low-temperature co-fired ceramic substrate, the buried components comprising at least one buried capacitor and at least one buried inductor, and wherein said buried components are defined by conductive traces formed within said substrate whose dimensions determine respective component values of said buried components.

2. The converter circuit of claim 1, further comprising at least one conductive layer located on or within the low temperature co-fired ceramic substrate, which electrically connects the circuitry of the VHF/UHF electronic power converter circuit.

3. The converter circuit of claim 2, further comprising a plurality of conductive pads for electronically connecting the components of the VHF/UHF electronic power converter circuit to said conductive layer.

4. The converter circuit of claim 3, further comprising at least one cavity formed within said low temperature co-fired ceramic substrate.

5. The converter circuit of claim 4, and further comprising at least one thermal via formed within said low temperature co-fired ceramic substrate.

6. The converter circuit of claim 3, further comprising at least one discrete component mounted on said low temperature co-fired ceramic substrate.

7. The converter circuit of claim 1, in which the buried passive components further include at least one buried resistor.

8. The converter circuit of claim 1, in which the buried passive components further include at least one buried transformer.

9. The converter circuit of claim 1, in which all of the passive components comprising a power oscillator, except a load, are buried within said co-fired ceramic structure.

10. The converter circuit of claim 1, including a tuned based power oscillator having an operating frequency of 100 mhz, ±3 mhz and an output power of between 3 and 11 watts, with all of the oscillator components, except a single RF power transistor, being an integral part of the substrate.

11. The converter circuit of claim 1, in which all passive components needed to form an RF amplifier, except the load, are buried within said co-fired ceramic structure.

12. The power conversion system of claim 11, wherein said low temperature co-fired ceramic structure comprises additionally:

transformer means coupled to said second filter network.

13. A VHF/UHF power conversion system incorporating a low temperature co-fired ceramic structure containing first and second filter networks, comprising:

a low temperature co-fired ceramic structure containing a plurality of buried capacitor, buried inductor and buried resistor elements, wherein said buried elements are defined by conductive traces formed within said substrate whose dimensions determine respective component values of said buried components, the structure comprising:

a plurality of capacitors, inductors and resistors configured to form a first filter network and a plurality of capacitors, inductors and resistors configured to form a second filter network; and an active circuit amplifier means mounted on the external surface of said co-fired ceramic structure, the input to said amplifier means being supplied by the output of said first filter network, the input of said first filter network being supplied by external means, said output of said amplifier means driving the input of said second filter network.

14. The power conversion system of claim 13, wherein said low temperature co-fired ceramic structure comprises additionally:

transformer means coupled to said first filter network.

15. The power conversion system of claim 13, wherein said transformer means is buried within said low temperature co-fired ceramic structure.

16. The power conversion system of claim 15, wherein said transformer means is buried within said structure.

17. In a VHF/UHF power conversion system, a low temperature co-fired ceramic structure containing buried passive circuitry:

said passive circuitry including at least one component selected from the class consisting of resistors, capacitors, inductors and transformers, the buried components comprising at least one buried capacitor and at least one buried inductor, and wherein said buried capacitor and inductor components are defined by conductive traces formed within said substrate whose dimensions determine respective component values of said buried components;

said buried passive components being surrounded on all sides by non-conductive ceramic material;

said buried passive components being interconnected with other buried components by way of at least one interconnection means selected from the class consisting of vias and conductive structures;

said buried passive components being connected to other components which are not buried through interconnection contact pads which are located on a surface of said low temperature co-fired ceramic structure.

18. A VHF/UHF power conversion system, selected from the class consisting of AC-AC, AC-DC and DC-DC power conversion systems, and comprising a low temperature co-fired ceramic structure containing buried passive circuitry:

said passive circuitry including at least one component selected from the class consisting of resistors, capacitors, inductors and transformer, the buried components comprising at least one buried capacitor and at least one buried inductor, and wherein said buried capacitor and inductor components are defined by conductive traces formed within said substrate whose dimensions determine respective component values of said buried components;

said buried passive components being surrounded on all sides by non-conductive ceramic material;

said buried passive components being interconnected with other buried passive components by way of at least one interconnection means selected from the class consisting of vias and conductive structures;

said buried passive components being connected to other components which are not buried through interconnection contact pads which are located on a surface of said low temperature co-fired ceramic structure.

* * * * *